United States Patent [19]
Huang

[11] Patent Number: 5,723,357
[45] Date of Patent: Mar. 3, 1998

[54] SUPPLEMENTARY IMPLANTATION METHOD FOR FABRICATING TWIN GATE CMOS

[75] Inventor: Hsiu-Wen Huang, Kaoshiung, Taiwan

[73] Assignee: United Microelectronics Corporation, Taipei, Taiwan

[21] Appl. No.: 808,259

[22] Filed: Feb. 28, 1997

[30] Foreign Application Priority Data

Oct. 11, 1996 [TW] Taiwan ................... 85112454

[51] Int. Cl.$^6$ ............................ H01L 21/70
[52] U.S. Cl. .................. 437/57; 437/34; 437/61; 437/186
[58] Field of Search .................. 437/34, 56, 57, 437/61, 186

[56] References Cited

U.S. PATENT DOCUMENTS

| | | | |
|---|---|---|---|
| 4,555,842 | 12/1985 | Levinstein et al. | 29/571 |
| 5,612,245 | 3/1997 | Saito | 437/57 |

Primary Examiner—John Niebling
Assistant Examiner—Long Pham
Attorney, Agent, or Firm—Rabin, Champagne & Lynt, P.C.

[57] ABSTRACT

A supplementary implantation method for fabricating a twin gate CMOS. A first conductivity-type well region and a second conductivity-type well region, with an isolating region therebetween, are formed on a semiconductor substrate. A gate oxide layer is formed on the surface of the first and second conductivity-type well regions. Next, a polysilicon layer is formed on the surface of the gate oxide layer and is lightly doped with ions of a first conductivity-type. Ions of a second conductivity-type are then implanted in the polysilicon layer above the first conductivity-type well region and thereby convert the layer into a lightly doped layer of the second conductivity-type, while leaving the polysilicon layer above the second conductivity-type well region still lightly doped with the first conductivity-type ions. A polysilicon gate of the second conductivity-type is formed on the first conductivity-type well region, and a polysilicon gate of the first conductivity-type is formed on the second conductivity-type well region. Ions of the first conductivity-type are next implanted in the second conductivity-type well region, and then ions of the second conductivity-type are implanted in the first conductivity-type well region, in separate operations, so as to increase the electrical conductivity of the respective first and second conductivity-type polysilicon gates, while simultaneously forming source/drain regions of the first conductivity-type on the substrate on opposite sides of the first conductivity-type polysilicon gate to establish a first conductivity-type transistor, and similarly forming source/drain regions of the second conductivity-type on the substrate on opposite sides of the second conductivity-type polysilicon gate, to establish a second conductivity-type transistor.

15 Claims, 4 Drawing Sheets

SUPPLEMENTARY IMPLANTATION METHOD FOR FABRICATING TWIN GATE CMOS

BACKGROUND OF THE INVENTION

1. Field of the Invention

The invention relates in general to a method for fabricating a twin gate CMOS, and more particularly to the method for fabricating twin gate CMOS components through supplementary implantation.

2. Description of the Related Art

In the conventional method for manufacturing twin gate transistors, the gates of the transistor are first defined on an undoped conducting layer and this is followed by a channel implantation which forms the source/drain terminals such that the conducting layer of the gate is doped in situ to increase its electrical conductivity. With the current trend of heavy reduction of semiconductor component dimensions in integrated circuits and the importance of preventing the short channel effect in the transistors due to excessive thickness in the source/drain diffusion regions, such layers have had to become thinner and thinner, and as a result, the impurity concentration resulting from channel implantation is also necessarily becoming lighter and lighter. Therefore, after the ion doping operation the impurity concentration in the conducting layer of the gate may be insufficient, which leads to an increase in sheet resistance and may affect both its electrical conductivity and the threshold voltage (Vt) level of the transistor.

In an improved version of the conventional method of fabricating a twin gate CMOS, in order to lessen the effects on threshold voltage level caused by low impurity concentration in the gates of the twin gate transistor, a heavier doping of impurities is performed in situ with the formation of the conducting layer of the transistor. The details of such a method are illustrated in FIGS. 1A through 1G.

First, referring to FIG. 1A, a first conductivity-type well region 14 and a second conductivity-type well region 16, with an isolating region 18 therebetween, are formed adjacent to each other on a P-type silicon substrate 10. The first conductivity-type well region 14 and the second conductivity-type well region 16, for example, can be a P-type well region (P-well) and an N-type well region (N-well) respectively, while the isolating region 18 is formed of an insulating material such as silicon dioxide. Next, a thermal oxidation method is used to form a gate oxide layer 20 on the substrate surface, and thereafter, chemical vapor deposition (CVD) is used to form a conductive layer 21 above the gate oxide layer. The conductive layer 21, for example, can be a polysilicon layer formed by deposition using disilane gas ($Si_2H_6$) and with P-type ion doping, for example, using diborane ($B_2H_6$), performed in situ for convening the polysilicon layer into a $P^+$-type polysilicon layer 21. Then, a first photoresist layer 23 is formed over the surface of the $P^+$-type polysilicon layer 21 above the N-type well region 16.

Referring next to FIG. 1B, in a subsequent step the exposed $P^+$-type polysilicon layer 21 is etched until the upper surface of the gate oxide layer 20 is exposed. Then, the first photoresist layer 23 is removed. CVD is again used to form a polysilicon layer on the surfaces of the exposed gate oxide layer 20 and the $P^+$-type polysilicon layer 21. The deposition uses disilane gas with N-type ion doping, for example, phosphorus ions, performed in situ, to convert the polysilicon layer into an $N^+$-type polysilicon layer 25.

Referring next to FIG. 1C, in the subsequent step a second photoresist layer 27 is formed over the surface of the $N^+$-type polysilicon layer 25 above the P-type well region 14, and then is etched back until the upper surface of the $P^+$-type polysilicon layer 21 is exposed.

Referring next to FIG. 1D, the second photoresist layer 27 is removed. Then, using a conventional photolithographic technique, a third photoresist layer 29 is formed above the respective $P^+$ and $N^+$-type polysilicon layers to act as a mask for defining the gates in subsequent steps.

Referring next to FIG. 1E, with the third photoresist layer 29 as a mask, the $P^+$ and $N^+$-type polysilicon layers are etched to mark out a $P^+$-type polysilicon gate 33 and an $N^+$-type polysilicon gate 31, and then the third photoresist layer is removed. Next, under high heat and in a steamy environment, thin layers of oxide 35P and 35N are formed on the respective surfaces of the $P^+$ and $N^+$-type polysilicon gates. Then, a conventional photolithographic technique is again used to form a fourth photoresist layer 37 over the surface of the gate oxide layer 35P above the N-type well region 16 and covering up the $P^+$-type polysilicon gate 33. Subsequently, a low concentration of N-type ions, for example, arsenic ions 39I, is used in a channel implantation process, to form $N^+$-type source/drain diffusion regions 39 on the substrate surface, on each side of the $N^+$-type polysilicon gate 31, thus completing the NMOS part of the CMOS component.

Referring next to FIG. 1F, in the subsequent step a fifth photoresist layer 41 is formed over the surface of the gate oxide layer 35N above the P-type well region 14 and covering up the $N^+$-type polysilicon gate terminal 31. Subsequently, a low concentration of P-type ions, for example, boron fluoride ions 43I, is used in a channel implantation process, to form $P^+$-type source/drain diffusion regions 43 on the substrate surface on each side of the $P^+$-type polysilicon gate 33, thus completing the PMOS part of the CMOS component. Next, referring to FIG. 1G, the fifth photoresist layer is removed to complete the twin gate transistor.

The conventional manufacturing process as described above requires two depositions of conducting layers, two in situ doping operations with ions of the opposite polarity, and multiple applications of a photolithographic technique, in order to define gate regions. Moreover, although the two subsequent channel implantations using ions of opposite polarity can counteract the high sheet resistance and correct the defect in the threshold voltage level caused by a low original impurity concentration in the transistor gate, the fabrication process is complicated.

SUMMARY OF THE INVENTION

It is therefore an object of the invention to provide a supplementary implantation method for fabricating twin gate CMOS components through which defects caused by a low impurity concentration in the transistor gate can be counteracted, and which is simpler to implement. According to this method, a first conductivity-type well region and a second conductivity-type well region, with an isolating region therebetween, are formed on a semiconductor substrate. A gate oxide layer is formed on the surface of the first and second conductivity-type well regions. Next, a polysilicon layer is formed on the surface of the gate oxide layer and is lightly doped with ions of a first conductivity-type. Ions of a second conductivity-type are then implanted in the polysilicon layer above the first conductivity-type well region so as to neutralize the first conductivity-type ions therein and thereby convert the layer into a lightly doped layer of the second conductivity-type, while leaving the polysilicon layer above the second conductivity-type well region still lightly doped with the first conductivity-type ions. Photolithographic and etching processes are then applied to define a pattern on the polysilicon layer. A polysilicon gate of the second conductivity-type is formed on the first conductivity-type well region, and a polysilicon gate of the first conductivity-type is formed on the second conductivity-type well region. Ions of the first conductivity-type are next implanted in the second conductivity-type well region, and then ions of the second conductivity-type are implanted in the first conductivity-type well region, in separate operations, so as to increase the electrical conductivity of the respective first and second conductivity-type polysilicon gates, while simultaneously forming source/drain regions of the first conductivity-type on the substrate on opposite sides of the first conductivity-type polysilicon gate to establish a first conductivity-type transistor, and similarly forming source/drain regions of the second conductivity-type on the substrate on opposite sides of the second conductivity-type polysilicon gate, to establish a second conductivity-type transistor.

BRIEF DESCRIPTION OF THE DRAWINGS

Other objects, features, and advantages of the invention will become apparent from the following detailed description of the preferred but non-limiting embodiments. The description is made with reference to the accompanying drawings in which.

DESCRIPTION OF THE PREFERRED EMBODIMENT

Figure 1A:
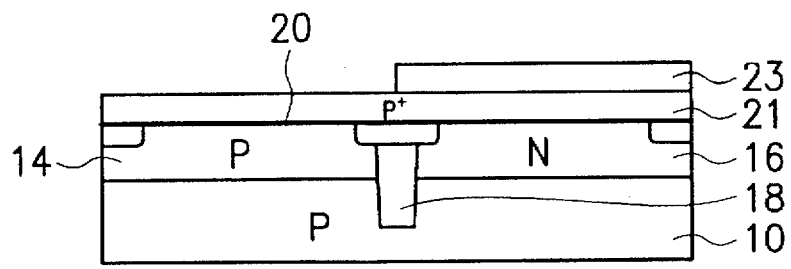
FIGS. 1A through 1G are cross-sectional views showing a process flow for manufacturing a conventional twin gate CMOS component.
Figure 1B:
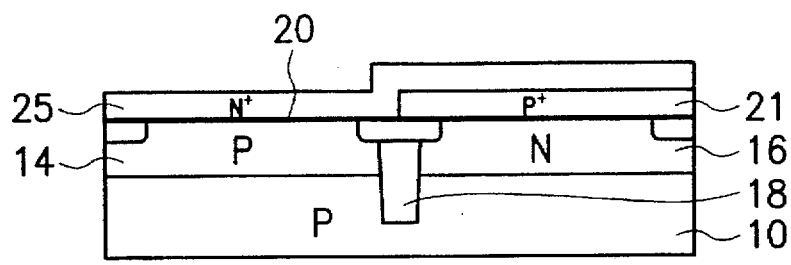
Figure 1C:
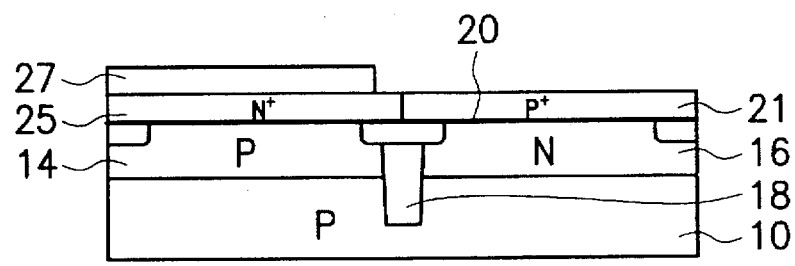
Figure 1D:
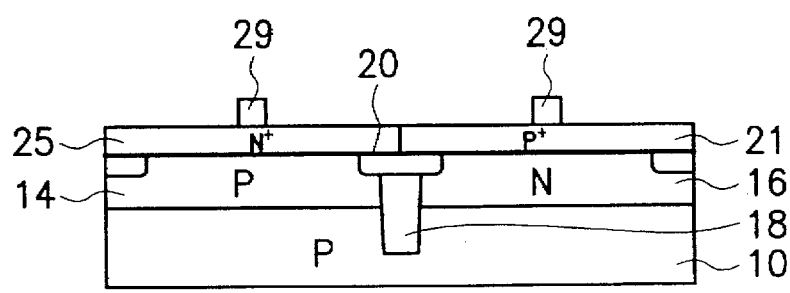
Figure 1E:
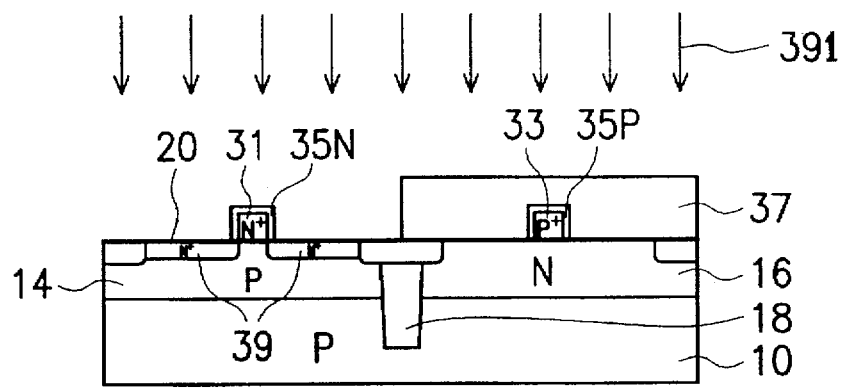
Figure 1F:
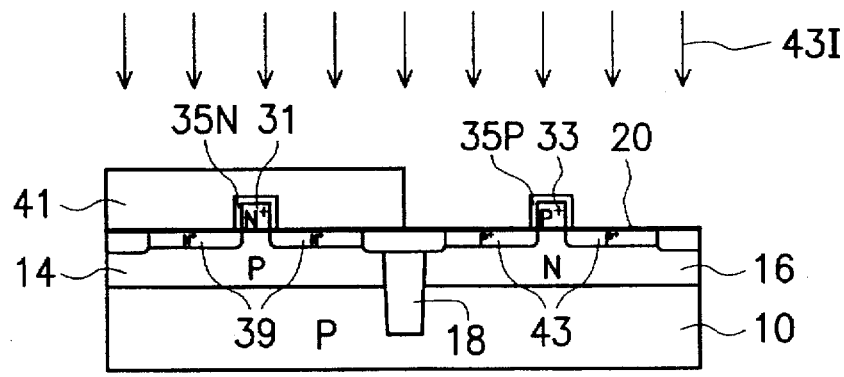
Figure 1G:
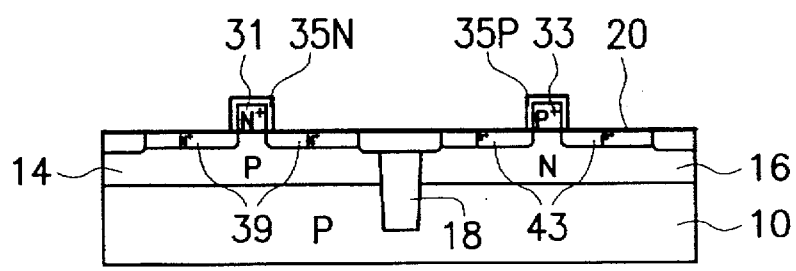
Figure 2A:
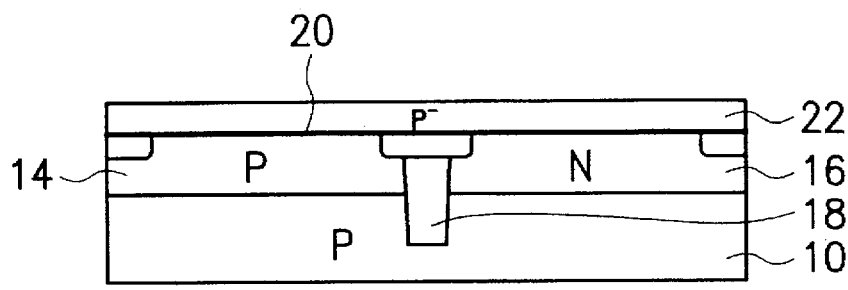
FIGS. 2A through 2F are cross-sectional views showing the process flow for manufacturing a twin gate CMOS component according to the invention.

Referring to FIG. 2A, a first conductivity-type well region 14 and a second conductivity-type well region 16, with an isolating region 18 therebetween, are formed adjacent to each other on a P-type silicon substrate 10 in a manner similar to that described above with reference to FIG. 1A. The first conductivity-type well region 14 and the second conductivity-type well region 16, for example, can be a P-type well region and an N-type well region, respectively, and the isolating region 18 is formed of an insulating material such as silicon dioxide. Next, a gate oxide layer 20 is formed on the substrate surface by thermal oxidation, with a thickness preferably in the range of 8 nm to 15 nm. Then, chemical vapor deposition (CVD) is used to form a conducting layer 22 above the gate oxide layer 20. The conducting layer 22, for example, can be a doped polysilicon layer with a thickness preferably in the range of 100 nm to 150 nm. While performing a deposition of the polysilicon layer using disilane ($Si_2H_6$), a low concentration of P-type ions such as diborane ($B_2H6$) is used as a dopant in situ to convert the polysilicon layer into a $P^-$-type polysilicon layer. The $P^-$-type polysilicon layer has an impurity concentration of approximately $1 \times 10^{20}$ atoms/$cm^3$.

Figure 2B:
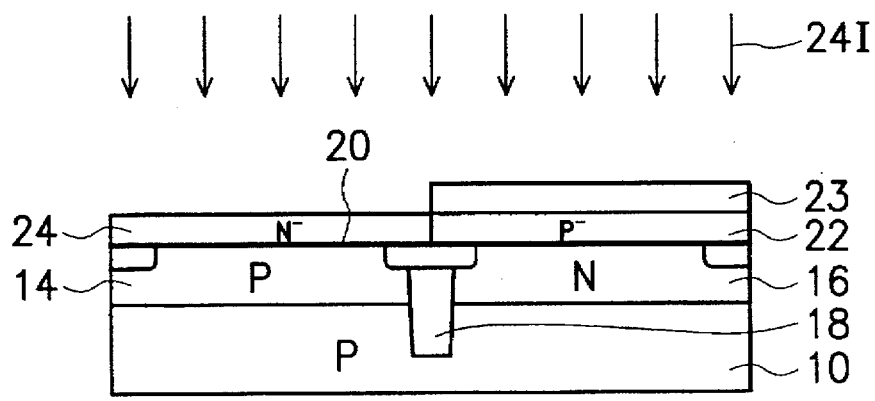

Referring next to FIG. 2B, in the subsequent step a first photoresist layer 23 is formed on the portion of the surface of the $P^-$-type polysilicon layer 22 above the N-well region 16. Then N-type ions are implanted in the polysilicon layer 22 above the portion of the P-well region not covered by the first photoresist layer 23, so as to neutralize the low concentration of P-type ions therein and convert the implanted portion of the layer 22 into a lightly doped N-type polysilicon layer 24, preferably with an impurity concentration of approximately $3 \times 10^{20}$ atoms/$cm^3$.

Figure 2C:
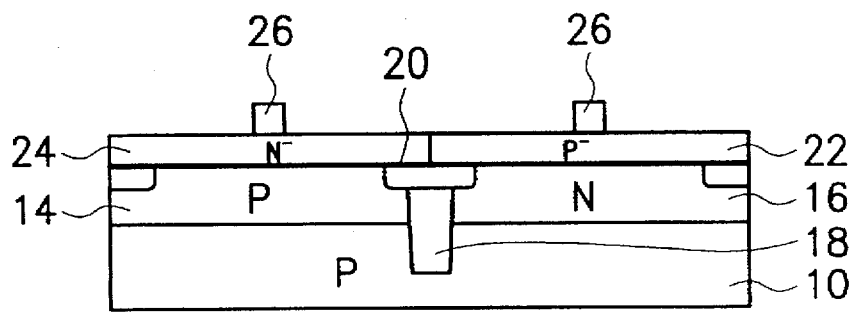

Referring next to FIG. 2C, the first photoresist layer 23 is removed and then, a second photoresist layer 26 is formed over the surface of the $P^-$ and $N^-$-type polysilicon layers, so as to act as a mask for the definition of gates in a subsequent process.

Figure 2D:
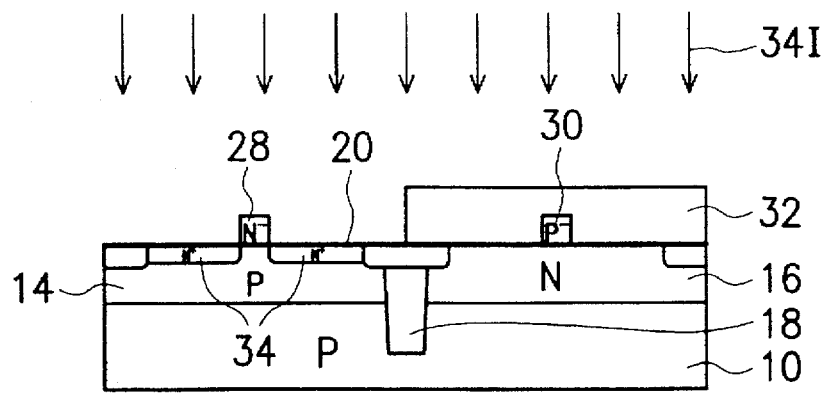

Referring next to FIG. 2D, in the subsequent step, with the second photoresist layer 26 acting as a mask, conventional photolithographic and etching processes are used to define an $N^-$-type polysilicon gate 28 and a $P^-$-type polysilicon gate 30. Next, a third photoresist layer 32 is formed over the gate oxide layer 20 above the N-well region 16, such that the $P^-$-type polysilicon gate 30 is completely covered. Then, N-type ions 34I, such as arsenic or phosphorus ions, are implanted in the P-well region 14. Through such an operation, not only is the impurity concentration in the $N^-$-type polysilicon gate 28 raised so that the terminal is converted into an $N^+$-type polysilicon gate 28' having an increased conductivity and a lowered sheet resistance, but also $N^+$-type source/drain diffusion regions 34 are formed on the substrate surface on each side of the now $N^+$-type polysilicon gate 28'. This completes the formation of the NMOS part of a CMOS component.

Figure 2E:
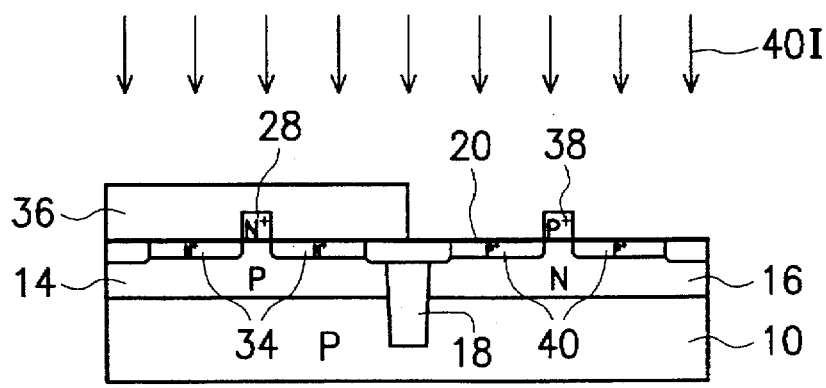
Figure 2F:
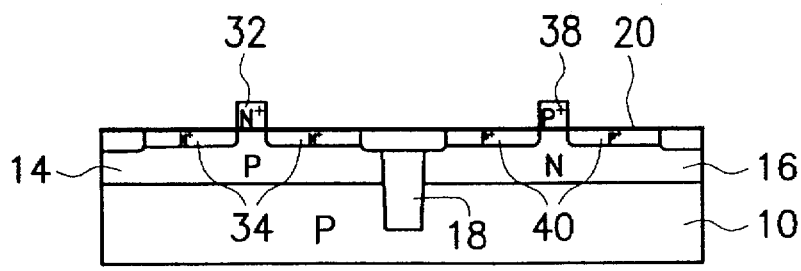

Referring next to FIG. 2E, in the subsequent step, the third photoresist layer 32 is removed and then a fourth photoresist layer 36 is formed over the gate oxide layer 20 above the P-well region 14, such that the $N^+$-type polysilicon gate 28' is also completely covered. Then, P-type ions 40I such as boron, boron fluoride or diborane ions, are implanted in the N-well region 16. Through such a procedure the impurity concentration in the $P^-$-type polysilicon gate 30 is raised to higher than approximately $2 \times 10^{20}$ atoms/$cm^3$, and therefore converted into a $P^+$-type polysilicon gate 38 having an increased conductivity and a lowered sheet resistance. Moreover, $P^+$-type source/drain diffusion regions 40 are formed by the same procedure on the substrate surface, on each side of the $P^+$-type polysilicon gate 38. This completes the formation of the PMOS part of a CMOS component.

The fourth photoresist layer 36 is then removed to provide the twin gate CMOS component.

While the invention has been described by way of example and in terms of the preferred embodiment, it is to be understood that the invention is not limited to the disclosed embodiment. To the contrary, it is intended to cover various modifications and similar arrangements as would be apparent to those skilled in the art. Therefore, the scope of the appended claims, which define the invention, should be accorded the broadest interpretation so as to encompass all such modifications and similar structures.

What is claim:

1. A method of fabricating a twin gate CMOS component using supplementary implantation, comprising of the steps of:

(a) forming a first conductivity-type well region and a second conductivity-type well region with an isolation region therebetween, on a semiconductor substrate;

(b) forming a gate oxide layer on a surface of the first and second conductivity-type well regions;

(c) forming a polysilicon layer lightly doped with first conductivity-type ions on a surface of the gate oxide layer;

(d) implanting second conductivity-type ions in a first portion of the polysilicon layer, above the first conductivity-type well region, so as to neutralize the first conductivity-type ions therein and convert the first portion into a lightly doped layer of the second conductivity-type, while leaving a second portion of the polysilicon layer above the second conductivity-type well region, still lightly doped with the first conductivity-type ions;

(e) using photolithographic and etching processes to define respective patterns on the first and second portions of the polysilicon layer, thereby respectively to form a polysilicon gate of the second conductivity-type on the first conductivity-type well region and a polysilicon gate of the first conductivity-type on the second conductivity-type well region;

(f) implanting ions of the first conductivity-type in the second conductivity-type well region, so as to increase an electrical conductivity of the polysilicon gate of the first conductivity-type, while simultaneously forming source/drain regions of the first conductivity-type on the substrate on opposite sides of the first conductivity-type polysilicon gate, to establish a first transistor; and (g) then implanting ions of the second conductivity-type in the first conductivity-type well region so as to increase a conductivity of the gate of the second conductivity-type while simultaneously forming source/drain regions of the second conductivity-type on the substrate on opposite sides of the second conductivity-type polysilicon gate, to establish a second transistor.

2. A method according to claim 1, wherein the first conductivity-type well region is a P-well.

3. A method according to claim 1, wherein the second conductivity-type well region is an N-well.

4. A method according to claim 1, wherein the isolation region is composed of a layer of silicon dioxide.

5. A method according to claim 1, wherein the gate oxide layer has a thickness which ranges approximately from 8 nm to 15 nm.

6. A method according to claim 1, wherein the ions of the first conductivity-type are chosen from a P-type ion group consisting of boron, boron fluoride and diborane ions.

7. A method according to claim 1, wherein the ions of the second conductivity-type are chosen from an N-type ion group consisting of arsenic and phosphorus ions.

8. A method according to claim 1, wherein the polysilicon layer has a thickness which ranges from 100 nm to 150 nm, and an impurity concentration thereof is approximately $1 \times 10^{20}$ atoms/cm$^3$ after doping lightly with the ions of the first conductivity-type.

9. A method according to claim 1, wherein the ions of the second conductivity-type are implanted into the polysilicon layer above the first conductivity-type well region so that after the neutralization of the ions of the first conductivity-type, the polysilicon layer is converted into a lightly doped layer of the ions of the second conductivity-type and having an impurity concentration of approximately $3 \times 10^{20}$ atoms/cm$^3$.

10. A method according to claim 1, wherein the first conductivity-type polysilicon gate is a P-type gate with an impurity concentration greater than approximately $2 \times 10^{20}$ atoms/cm$^3$.

11. A method according to claim 1, wherein the second conductivity-type polysilicon gate is an N-type gate with an impurity concentration greater than $3 \times 10^{20}$ atoms/cm$^3$.

12. A method according to claim 1, wherein the first conductivity-type source/drain regions are P-type diffusion regions.

13. A method according to claim 1, wherein the second conductivity-type source/drain regions are N-type diffusion regions.

14. A method according to claim 1, wherein the first transistor is a PMOS transistor comprised of a P$^+$-type polysilicon gate, P$^+$-type source/drain diffusion regions and an N-type well region.

15. A method according to claim 1, wherein the second transistor is an NMOS transistor comprised of an N$^+$-type polysilicon gate, N$^+$-type source/drain diffusion regions and a P-type well region.

\* \* \* \* \*